United States Patent

Huang

[11] Patent Number: 6,074,908
[45] Date of Patent: Jun. 13, 2000

[54] PROCESS FOR MAKING MERGED INTEGRATED CIRCUITS HAVING SALICIDE FETS AND EMBEDDED DRAM CIRCUITS

[75] Inventor: Jenn Ming Huang, Hsin-Chu, Taiwan

[73] Assignee: Taiwan Semiconductor Manufacturing Company, Hsin-Chu, Taiwan

[21] Appl. No.: 09/318,923

[22] Filed: May 26, 1999

[51] Int. Cl.[7] .............................................. H01L 21/8242
[52] U.S. Cl. ..................... 438/241; 438/239; 438/253; 438/592
[58] Field of Search .................... 438/241, 239, 438/253, 592

[56] References Cited

U.S. PATENT DOCUMENTS

| | | | |
|---|---|---|---|
| 5,395,778 | 3/1995 | Walker | 437/43 |
| 5,472,892 | 12/1995 | Gwen et al. | 437/43 |
| 5,573,980 | 11/1996 | Yoo | 437/200 |
| 5,668,035 | 9/1997 | Fang et al. | 438/239 |
| 5,668,065 | 9/1997 | Lin | 438/303 |
| 5,843,817 | 12/1998 | Lee et al. | 438/239 |
| 5,863,820 | 1/1999 | Huang | 438/241 |

Primary Examiner—John F. Niebling
Assistant Examiner—Jennifer M. Kennedy
Attorney, Agent, or Firm—George O. Saile; Stephen B. Ackerman

[57] ABSTRACT

A method for fabricating merged logic and DRAM integrated circuits (ICs) is achieved. An undoped polysilicon layer is deposited and protected over the logic region while a first polycide layer is deposited and patterned to form DRAM gate electrodes in the memory region. DRAM gate electrodes are then protected with an insulating layer and the undoped polysilicon is exposed and patterned to form logic gate electrodes. The source/drain areas and undoped polysilicon are doped by implanting and a titanium metal is deposited and annealed to form salicide FETs for logic circuits. This allows the IC to be fabricated having different FET gate-oxide thicknesses for the logic and memory circuits, different sidewall-spacer widths, self-aligned contacts, separate liner layers to optimize the formation of borderless metal contacts with reduced contact resistance, and different lightly doped drains in the logic and memory circuits to maximize the overall circuit performance. The merged integrated circuit is now completed to the first level of metal interconnections by forming bit lines and capacitors which are insulated, by forming metal contacts through the insulation, and by patterning a metal layer to form the first level of metal interconnections.

20 Claims, 4 Drawing Sheets

PROCESS FOR MAKING MERGED INTEGRATED CIRCUITS HAVING SALICIDE FETS AND EMBEDDED DRAM CIRCUITS

BACKGROUND OF THE INVENTION

(1) Field of the Invention

This invention relates to semiconductor integrated circuit devices, and more particularly to a method for integrating self-aligned silicide (SALICIDE) field effect transistors (FETs) for logic circuits with dynamic random access memory (DRAM) having self-aligned contacts and capacitors over bit lines (COBs). The method is particularly useful for integrating (embedding) high-density memory with high-performance logic on the same chip.

(2) Description of the Prior Art

Merged logic and memory circuits are finding extensive use in the electronics industry. These circuits, such as microprocessors, are used in the computer industry for general purpose computing. Merged integrated circuits are also used for application-specific circuits (ASC) in other industries, such as automobiles, toys, communications, the like.

To optimize these merged circuits, it is desirable in the electronics industry to form the FETs for the logic and DRAM circuits having different FET process parameters. For example, it is desirable to use a thin gate oxide for the logic FETs and the peripheral circuits for the DRAMs to increase performance (circuit speed), while it is desirable to use a thicker gate oxide, narrower sidewall spacers, and self-aligned contacts (SACs) for the FET access transistors of the DRAM memory cells because of the higher gate voltage ($V_g$), and also to achieve high density of memory cells and higher yield. It is desirable to integrate the logic and memory circuits on the same chip by using a process that minimizes manufacturing costs.

One method of forming FETs for logic and memory having two different gate oxide thicknesses is described in U.S. Pat. No. 5,668,035 to Fang et al. However, the polycide gate electrodes are of the same thickness and are etched at the same time on both the logic and memory. The application does not address the ability to make sidewall spacers on separate gate electrodes having different widths on the logic and memory. Further, Fang's method does not include making salicide FETs for logic. Huang in U.S. Pat. No. 5,863,820 teaches a method for integrating DRAMs with self-aligned contacts and salicide FETs for logic on the same chip. However, Huang does not teach a method for making memory and logic FETs having different gate-oxide thicknesses and different sidewall-spacer widths. Yoo in U.S. Pat. No. 5,573,980 describes a method for making silicide contacts self-aligned to FET gate electrodes for static RAM cells but does not address merged memory and logic circuits on the same chip. In U.S. Pat. No. 5,472,892 to Gwen et al., a method is disclosed for using a silicide process in making a floating gate memory device and peripheral transistors on the same chip. Lin in U.S. Pat. No. 5,668,065 describes a method for making simultaneously silicide-based self-aligned contacts and logical interconnections, but does not teach integrating memory and logic circuits on the same chip.

Therefore there is still a need in the semiconductor industry to provide a very manufacturable cost-effective process for making merged integrated circuits having salicide FETs for logic circuits and embedded DRAMs with self-aligned node contacts (SACs).

SUMMARY OF THE INVENTION

It is a principal object of the present invention to provide a method form self-aligned titanium silicide FETs for high performance logic circuits with memory circuits having tungsten silicide gate electrodes and self-aligned capacitor node contacts integrated on the same chip.

It is another object of the present invention to achieve the above objective using different gate oxides in the logic and memory circuits, different sidewall-spacer widths, self-aligned contacts with reduced contact resistance, separate liner layers to optimize the formation of borderless metal contacts and self-aligned contacts, and to allow different lightly doped drains in the logic and memory circuits to minimize short-channel effects.

Still another object of this invention is to achieve these objectives without increasing the number of photoresist masking steps, without compromising logic performance and without adding to DRAM cost.

The method for making these merged integrated circuits having self-aligned silicide (salicide) FETs integrated with dynamic random access memory (DRAM) circuits, is now briefly described.

The method begins by providing a semiconductor substrate. Typically the substrate is a $P^-$ doped single-crystal silicon having a <100> crystallographic orientation. A field oxide is formed using shallow trench isolation (STI) to surround and electrically isolate device areas in logic regions and DRAM regions on the substrate. A thin first gate oxide is formed on the device areas. An undoped first polysilicon layer is deposited by low-pressure chemical vapor deposition (LPCVD) on the substrate. A first insulating layer, such as silicon oxide ($SiO_2$), is deposited on the first polysilicon layer. The first insulating layer and the first polysilicon layer are removed over the memory region using a photoresist mask and plasma etching. A second gate oxide is formed on the device areas in the memory region. An N doped second polysilicon layer and an upper tungsten metal silicide layer are deposited to form a first polycide layer. Next, a silicon nitride ($Si_3N_4$) hard-mask layer is deposited on the silicide layer. A photoresist mask and anisotropic etching are used to pattern the hard-mask layer and the first polycide layer to form gate electrodes for DRAMs in the memory region device areas, while the logic region is protected from etching. Lightly N doped first source/drain areas are formed adjacent to the DRAM gate electrodes by implanting phosphorus ions ($P^{31}$). A conformal $Si_3N_4$ layer is deposited and etched back to form insulating sidewall spacers on the gate electrodes. A thin conformal $Si_3N_4$ liner layer is deposited. A second insulating layer, such as $SiO_2$ or a borophosphosilicate glass (BPSG), is deposited to form an interpolysilicon oxide-1 (IPO-1) layer. The second insulating layer is chemically-mechanically polished back to the hard-mask layer over the logic region, and concurrently a planar second insulating layer is formed over the memory region. The $Si_3N_4$ hard-mask layer, the first polycide layer and the first insulating layer are removed over the logic region by etching, while the second insulating layer protects the memory region. The undoped first polysilicon layer is patterned to form FET gate electrodes in the device areas in the logic region. Lightly doped source/drain (LDD) areas are formed by ion implanting arsenic ions ($As^{75}$) adjacent to the gate electrodes in the logic region. A conformal $Si_3N_4$ layer is deposited and anisotropically etched back to form insulating sidewall spacers on the gate electrodes in the logic region. A third ion implantation is used to form second source/drain contact areas adjacent to the sidewall spacers on the gate electrodes in the logic region, and concurrently to dope the undoped polysilicon gate electrodes. The salicide FETs are now formed by depositing a conformal titanium metal layer and annealing to selectively form a titanium silicide on the silicon surface of the second source/drain areas and on the doped polysilicon gate electrodes. The unreacted titanium metal is selectively removed from the insulating sidewall spacers and other insulating surfaces on the substrate, thereby forming salicide FETs. Next, a thin blanket silicon oxynitride (SiON) etch-stop layer is deposited which is used in subsequent processing for etching borderless metal contact openings. A third insulating layer, such as BPSG, is deposited and chem-mech polished back to the second insulating layer over the memory region to form a globally planar surface. First contact openings are then etched in the second insulating layer and are filled with a doped polysilicon layer which is then etched or polished back to form polysilicon bit-line plugs and polysilicon capacitor node plugs. The openings are etched extending over the gate electrodes in the memory region to form self-aligned polysilicon contacts. A fourth insulating layer, such as $SiO_2$ or BPSG, is deposited and second contact openings are etched to the polysilicon bit-line plugs. A second polycide layer is deposited and patterned to form the bit lines. A fifth insulating layer is deposited to complete a second interpolysilicon oxide (IPO-2) layer. Third contact openings are etched in the fifth insulating layer and are filled with a doped polysilicon to form electrical contacts to the polysilicon capacitor node plugs. Next, a sequence of process steps is used to form a stacked capacitor over the electrical contacts. The stacked capacitors having increased capacitance can be formed as commonly practiced in the industry to make fin-shaped, crown-shaped, cylindrical, and the like capacitors. Typically, the capacitor consists of a bottom electrode formed from a patterned polysilicon layer, a thin interlevel dielectric layer, and a top electrode formed from another doped polysilicon layer. A sixth insulating layer is deposited and planarized over the stacked capacitors. Fourth contact openings are etched in the insulating layers to the first polycide layer in the memory region, and concurrently openings are etched to the thin etch-stop layer over the metal silicide on the second source/drain areas in the logic region. The etch-stop layer is removed in the fourth openings, and the fourth contact openings are then filled with metal to form metal contacts. A low-resistivity metal layer, such as aluminum/copper (Al/Cu) is deposited and patterned to form first metal interconnections. An interlevel dielectric (ILD) layer is deposited, and fifth contact openings are etched and filled with metal to form the next level of metal interconnections. The process for forming the first level of interconnections is then repeated to complete the wiring of the merged integrated circuit.

BRIEF DESCRIPTION OF THE DRAWINGS

The objects and advantages of this invention are best understood with reference to the attached drawings in the figures and the embodiment that follows.

DESCRIPTION OF THE PREFERRED EMBODIMENT

The method for making these merged integrated circuits having logic circuits with embedded DRAMs is now described in detail. The logic and DRAM FETs are formed separately on a substrate during processing. Therefore the FET gate oxides, sidewall spacers and ion implantation can be individually optimized for the logic and memory circuits to maximize the overall circuit performance. The process is described for making only N-channel FETs in the logic circuits to simplify the drawings and discussion. However, it should be also be well understood by one skilled in the art that by including additional process steps, in addition to those described in this embodiment, other types of devices can be included on the logic and DRAM circuits. For example, by including N-well and P-well regions on a substrate, P-channel and-channel FETs can be provided from which Complementary Metal-Oxide-Semiconductor (CMOS) circuits can be formed. Also the salicide FETs formed in the logic portion of the chip can be used for the peripheral read/write circuits on the DRAM portion of the chip to further improve performance.

Figure 1:
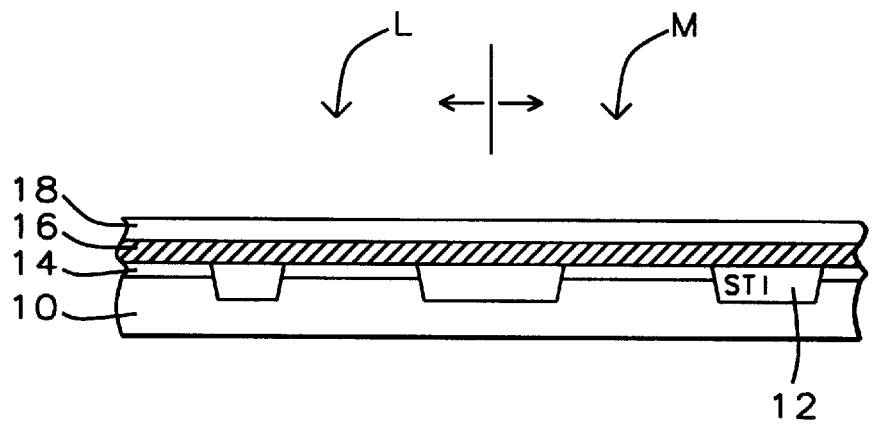
FIGS. 1 through 9 are schematic cross-sectional views showing the sequence of process steps for making merged integrated circuits having salicide FETs for logic circuits with embedded DRAM circuits.

Referring now to FIG. 1, the method begins by providing a semiconductor substrate 10, a portion of which is shown in the Figs. The figures show the substrate having a region L for logic circuits and a region M for DRAM circuits. Typically the substrate 10 is a $P^-$ doped single-crystal silicon having a <100>crystallographic orientation. Field oxide regions 12 are formed surrounding and electrically isolating the device areas in both regions L and M. For advanced high-density circuits the preferred field oxide 12 is a Shallow Trench Isolation (STI), as is commonly practiced in the semiconductor industry. Generally the STI is formed by etching trenches in the field oxide areas on the substrate to a depth of between about 2500 and 4000 Angstroms. After forming a thin thermal oxide in the trenches, the trenches are filled with an insulating material such as silicon oxide ($SiO_2$), and are made planar with the surface of the substrate 10, for example, by using a planarizing etch-back or chemical/mechanical polishing (CMP).

Still referring to FIG. 1, a thin first gate oxide 14 is formed on the device areas, for example, by thermal oxidation. Since the first gate oxide 14 is used for the logic region L, the oxide is grown to a thickness of only about 20 to 100 Angstroms to improve FET performance. Next, an undoped first polysilicon layer 16 is deposited by low-pressure chemical vapor deposition (LPCVD) using, for example, silane ($SiH_4$) as the reactant. The thickness of the undoped polysilicon layer 16 is between about 1000 and 1500 Angstroms. A first insulating layer 18, such as silicon oxide ($SiO_2$), is deposited by LPCVD on the undoped first polysilicon layer 16 using tetraethosiloxane (TEOS) as the reactant gas, and the oxide is deposited to a thickness of about 200 Angstroms or less. Layer 18 is optional.

Figure 2:
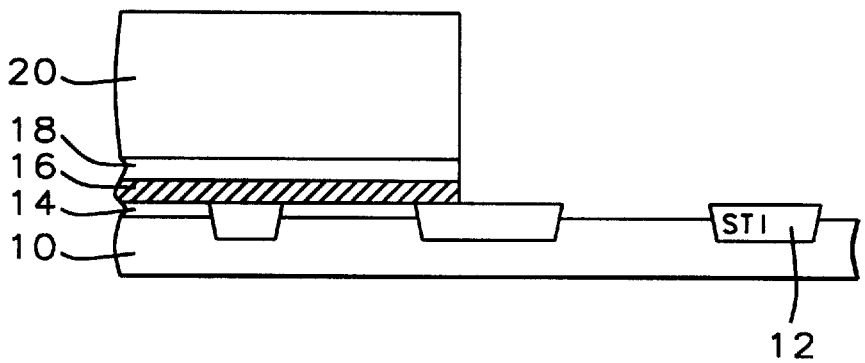

Referring to FIG. 2, conventional photolithographic techniques and plasma etching are used to remove the first insulating layer 18 and the undoped first polysilicon layer 16 over the memory region M, while the photoresist mask 20 protects region L from etching. Next, the remaining first gate oxide layer 14 is removed from the device areas in region M, for example, using a dilute hydrofluoric acid etch.

Figure 3:
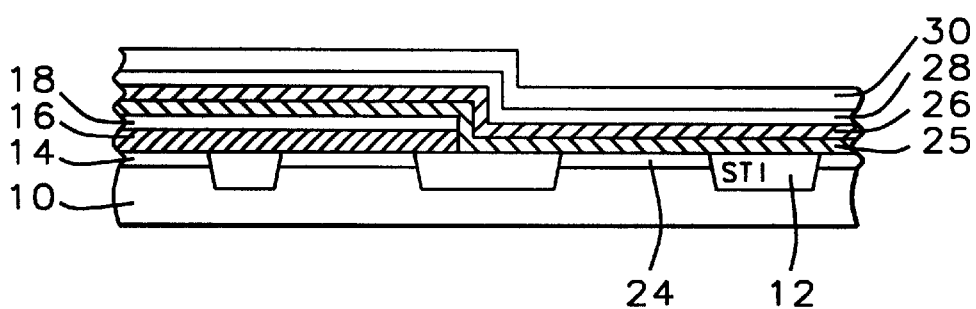

Referring to FIG. 3, a second gate oxide 24 is formed on the device areas in the memory region M for the access transistors. The second gate oxide 24 is formed preferably by thermal oxidation to a thickness of between about 80 and 100 Angstroms. Next, an N doped second polysilicon layer 25 and an upper tungsten metal silicide layer 26 are deposited to form a first polycide layer. The second polysilicon layer 25 is deposited by LPCVD using, for example, $SiH_4$ as the reactant gas, and is deposited to a thickness of between about 1000 and 1500 Angstroms. Layer 25 is doped with arsenic or phosphorus, either by ion implantation or in-situ during deposition, to a concentration of between about 1.0 E 19 and 1.0 E 21 atoms/cm$^3$. The tungsten silicide (WSi$_x$) layer 26 is deposited by LPCVD using tungsten hexafluoride (WF$_6$) and SiH$_4$ as the reactant gases, and is deposited to a thickness of between about 1000 and 1500 Angstroms. Next, an optional SiO$_2$ layer 28, about 300 Angstroms thick, can be deposited as a stress-release and adhesion layer. A Si$_3$N$_4$ hard-mask layer 30 is then deposited by LPCVD using dichlorosilane (SiCl$_2$H$_2$) and ammonia (NH$_3$) as the reactant gases. The Si$_3$N$_4$ layer 30 is deposited to a thickness of between about 1500 and 2000 Angstroms.

Figure 4:
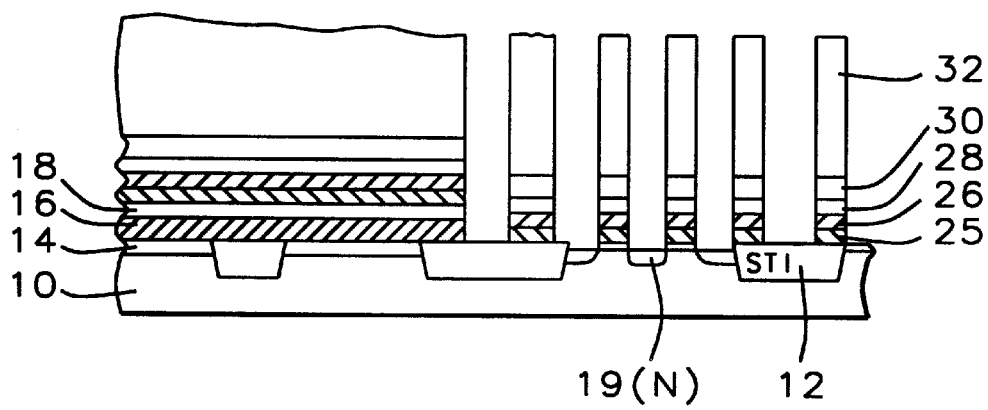

Referring to FIG. 4, conventional photolithographic techniques using a photoresist mask 32 and anisotropic etching are used to pattern the hard-mask layer 30 and the first polycide layer (26 and 25) to form gate electrodes for the access transistors in the memory cell region M for the DRAM devices. The photoresist mask 32 is also used to protect the logic region L during etching. The photoresist mask 32 is then removed by plasma ashing in oxygen (O$_2$) and/or wet stripping. Lightly N doped first source/drain areas 19(N) are formed adjacent to the gate electrodes in the memory region M by implanting phosphorus ions (P$^{31}$). The phosphorus is preferably implanted at a dose of between about 1.0 E 13 and 1.0 E 15 atoms/cm$^2$, and more specifically at a dose of 2.0 E 13 atoms/cm$^2$, and at an implant energy of about 40 KeV.

Figure 5:
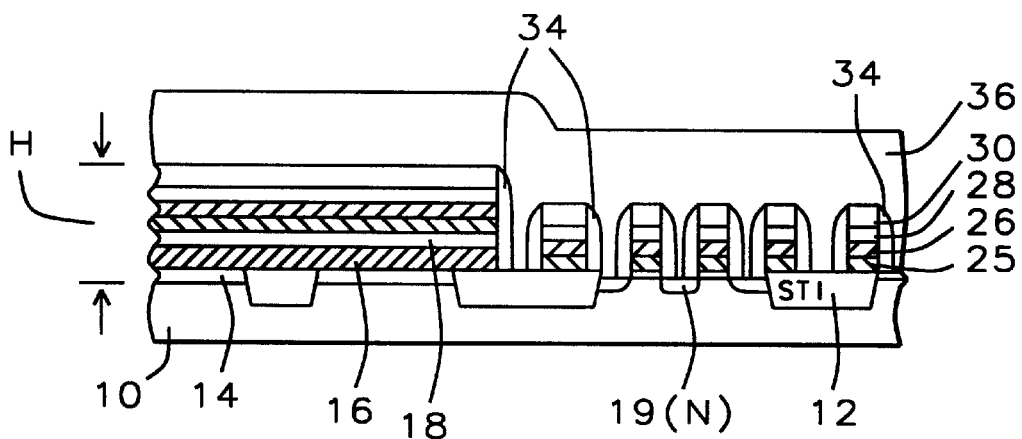

Referring to FIG. 5, a conformal Si$_3$N$_4$ layer 34 is deposited and anisotropically etched back to form insulating sidewall spacers 34 on the gate electrodes for the DRAMs. The Si$_3$N$_4$ layer 34 can be deposited to a thickness to optimize the DRAM FETs. Preferably the Si$_3$N$_4$ layer 34 is deposited to a thickness of between about 400 and 2000 Angstroms. The Si$_3$N$_4$ layer 34 is then anisotropically etched back using reactive ion etching (RIE) to form sidewall spacers 34 that have a width of 500 Angstroms or less. Alternatively, layer 34 can be silicon oxynitride (SiON). After forming the sidewall spacers 34, a thin conformal Si$_3$N$_4$ liner layer (not shown) is deposited to a thickness of 200 Angstroms or less to protect the substrate when self-aligned contacts for the DRAM cells are etched in a subsequent process step.

Still referring to FIG. 5, a second insulating layer 36 is deposited to form an interpolysilicon oxide-1 (IPO-1) layer. Layer 36 is preferably a SiO$_2$ deposited by LPCVD using TEOS and ozone as the reactant gases. If layer 36 is a borophosphosilicate glass (BPSG) then boron and phosphorus dopant gases are included during deposition. Second insulating layer 36 is deposited to a thickness that is greater than the height H of the multilayer (layers 16, 18, 25, 26, 28, and 30) as shown in FIG. 5, and more specifically to a thickness of between about 6000 and 8000 Angstroms.

Figure 6:
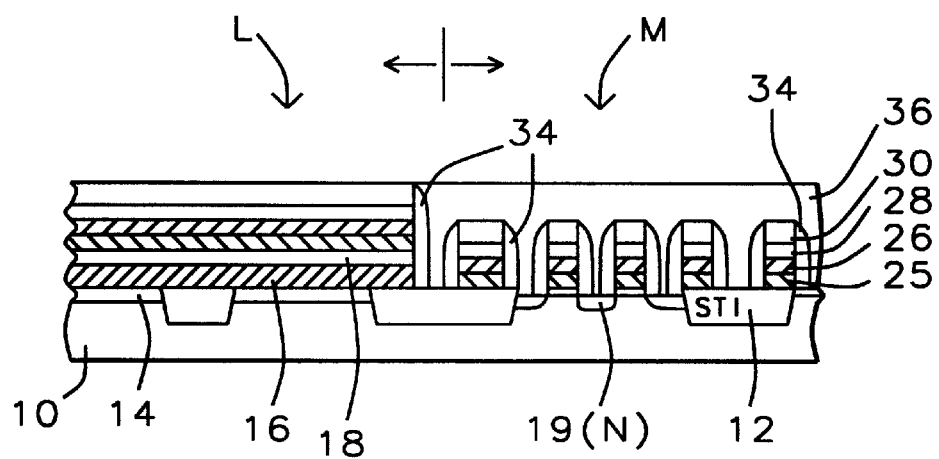

Referring now to FIG. 6, the second insulating layer 36 is chemically-mechanically polished back to the hard-mask layer 30 over the logic region L, and results in a planar second insulating layer 36 over the memory region M. The polishing of layer 34 can be carried out using a polishing tool and polishing slurry as commonly practiced in the industry.

Figure 7:
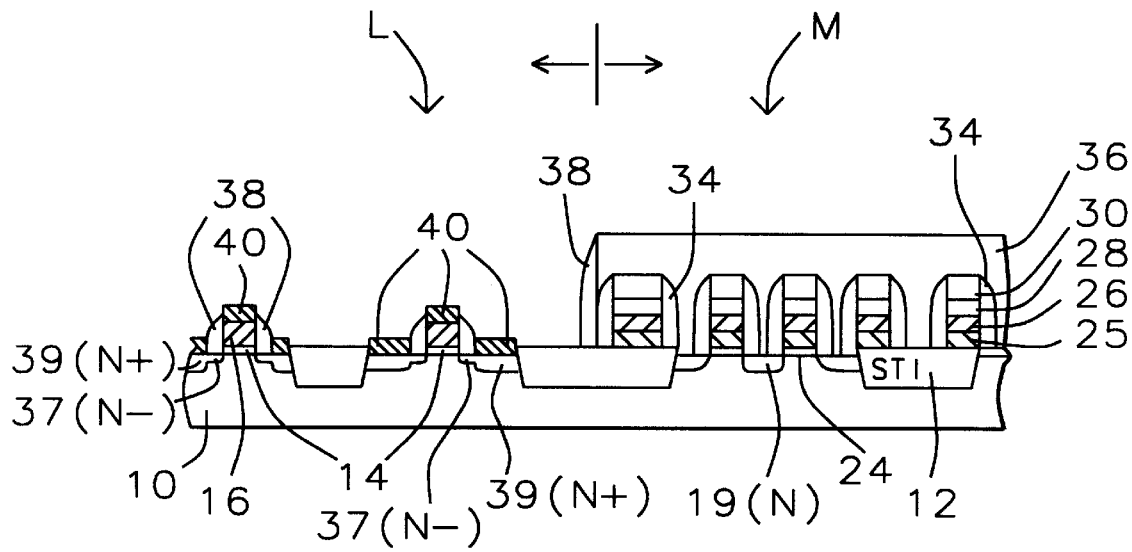

Referring to FIG. 7, the Si$_3$N$_4$ hard-mask layer 30, the SiO$_2$ layer 28, the first polycide layer (26 and 25), and the first insulating layer 18 are removed over the logic region L by etching, while the second insulating layer 36 protects the memory region M. The hard-mask layer 30 is removed preferably by etching in phosphoric acid (H$_3$PO$_4$), and the WSi$_x$ layer 26 and the polysilicon layer 25 are removed by plasma etching using an etchant gas containing chlorine (Cl$_2$).

Still referring to FIG. 7, the salicide FETs for the logic circuits are now formed in the logic region L. Conventional photolithographic techniques and anisotropic etching are used to pattern the exposed undoped first polysilicon layer 16 to form the FET gate electrodes. The etching is carried out in a HDP etcher using an etchant gas containing Cl$_2$ that etches the polysilicon selectively to the underlying first gate oxide 14. Next, lightly doped source/drain (LDD) areas 37(N$^-$) are formed by ion implanting arsenic ions (As$^{75}$) adjacent to the gate electrodes in the logic region L. Then a conformal Si$_3$N$_4$ layer 38 is deposited and anisotropically etched back to form insulating sidewall spacers 38 on the gate electrodes in the logic region L. Preferably the Si$_3$N$_4$ layer 38 is deposited to a thickness of about 1000 Angstroms or less and is etched back to form sidewall spacers having a width of about 1000 Angstroms or less. Since these sidewall spacers 38 and the first gate oxide are formed separately from the sidewall spacers 34 and second gate oxide 24 in the memory region M, the performance (speed) of the logic FETs can be optimized. A third ion implantation is used to form second source/drain contact areas 39(N$^+$) adjacent to the sidewall spacers 38 on the gate electrodes in the logic region L, and concurrently this ion implantation is used to dope the undoped polysilicon gate electrodes (layer 16). Preferably the LDD areas 37 are doped by implanting with As$^{75}$ ions to a concentration of between about 1.0 E 18 and 1.0 E 19 atoms/cm$^3$ and the contact areas 39 are also doped with As$^{75}$ ions to a concentration of between about 1.0 E 19 and 1.0 E 20 atoms/cm$^3$.

Still referring to FIG. 7, the salicide FETs are now completed, as commonly practiced in the industry. The substrate is etched in a dilute HF for a short time (less than 20 seconds) to remove any oxide on the source/drain contacts 39. Then a conformal titanium (Ti) metal layer is deposited and annealed to selectively form a titanium silicide (TiSi$_x$) 40 on the exposed silicon surface of the second source/drain areas 39(N$^+$) and on the doped polysilicon gate electrodes (doped layer 16) in the logic region L. Typically the Ti is deposited by sputter deposition to a thickness of between about 200 and 400 Angstroms. The Ti is reacted by rapid thermal anneal at a temperature of between about 500 and 700° C. for about 30 seconds. The unreacted Ti metal on the oxide surfaces, which include the sidewall spacers 38, is selectively removed by etching in a solution of NH$_4$OH and H$_2$O$_2$. After removing the unreacted Ti, a second rapid thermal anneal is carried out at a temperature of between about 700 and 900° C. for about 30 seconds to complete the reaction and to reduce the sheet resistance of the TiSi$_x$ 40.

Figure 8:
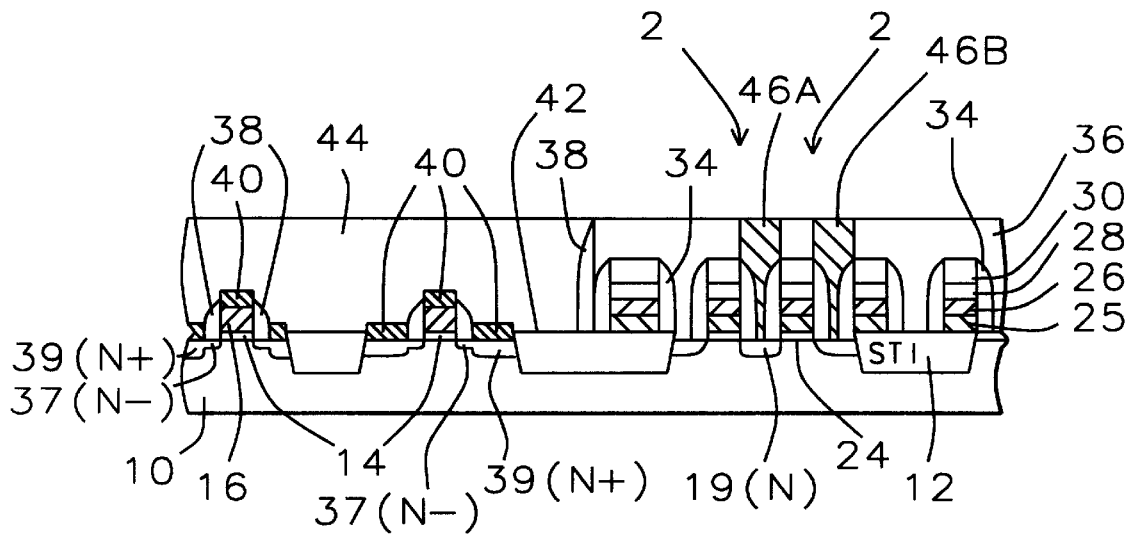

Referring to FIG. 8, a thin blanket silicon oxynitride (SiON) etch-stop layer 42 is deposited which is used in subsequent processing for etching borderless metal contact openings. Layer 42 is deposited by LPCVD using, for example SiH$_4$, nitrous oxide (N$_2$O), and NH$_3$ as the reactant gases. The oxynitride layer 42 is deposited to a thickness of between about 200 and 500 Angstroms. Continuing, a third insulating layer 44, such as SiO$_2$, is deposited by high-density plasma CVD at a relatively low temperature of less than about 600° C. The third insulating layer 44 is deposited to a thickness that is greater than the height of the polished back second insulating layer 36, and more specifically to a thickness of about 6000 to 8000 Angstroms. Layer 44 is then chem-mech polished back to the second insulating layer 36 over the memory region M to form a globally planar surface 44, as shown in FIG. 8. Alternatively, a doped oxide such as BPSG can be used as the third insulating layer 44.

Still referring to FIG. 8, using conventional photolithographic techniques and anisotropic plasma etching, first contact openings 2 are selectively etched in the second insulating layer 36 to the Si$_3$N$_4$ liner layer (not shown). The openings 2 are etched extending over the gate electrodes in the memory region M to form self-aligned contact openings. After removing the thin (200 Angstroms thick) liner layer by a brief plasma etch using a fluorine-containing gas and O$_2$, the openings 2 are filled by depositing a polysilicon layer 46 that is in-situ doped with phosphorus to a concentration of between about 1.0 E 19 and 1.0 E 21 atoms/cm$^3$. Layer 46 is then etched or polished back to form polysilicon bit-line plugs 46A and polysilicon capacitor node plugs 46B.

Figure 9:
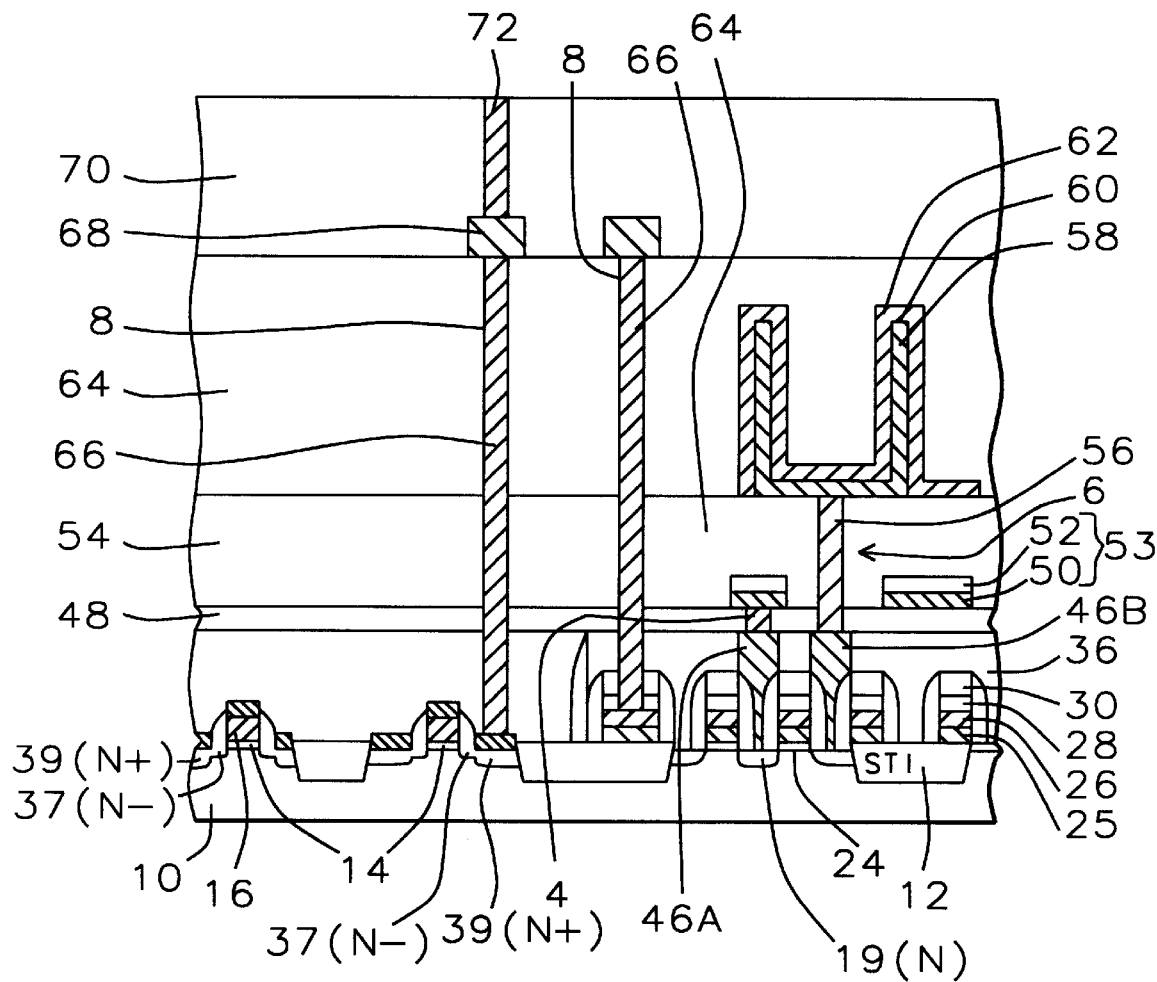

Referring to FIG. 9, a fourth insulating layer 48, such as SiO$_2$ or BPSG, is deposited by CVD to a thickness of between about 1000 and 1500 Angstroms. Second contact openings 4 are etched anisotropically in the fourth insulating layer 48 to the polysilicon bit-line plugs 46A. A second polycide layer, consisting of a doped polysilicon layer 50 and a tungsten silicide layer 52, is deposited and patterned to form the polycide bit lines 53. A fifth insulating layer 54, is deposited to complete a second interpolysilicon oxide (IPO-2) layer. Layer 54 is SiO$_2$ or BPSG, and is deposited by CVD to a thickness of between about 2000 and 4000 Angstroms over the bit lines 53. Third contact openings 6 are etched in the fifth insulating 54 layer to the polysilicon capacitor node plugs 46B. A doped polysilicon layer 56 is deposited sufficiently thick to fill the openings 6, and is polished back to form electrical contacts, also labeled 56, to the node plugs 46B. Next, a sequence of process steps is used to form a stacked capacitor over and contacting the electrical contacts 56. The stacked capacitors having increased capacitance can be formed as commonly practiced in the industry to make fin-shaped, crown-shaped, cylindrical, or other high-capacitance capacitors. Typically, the capacitor consists of a polysilicon bottom electrode 58, a thin interlevel dielectric layer 60, and a polysilicon top electrode 62. A sixth insulating layer 64 is deposited and planarized over the stacked capacitors. Fourth contact openings 8 are anisotropically etched in the insulating layers 64, 54, 48, 36, and 30 to the first polycide layer (25 and 26) in the memory region M, and concurrently openings are etched to the thin SiON etch-stop layer 42 over the titanium silicide layer 40 on the second source/drain areas 39 in the logic region L. The SiON etch-stop layer 42 is removed in the fourth openings 8. The contact openings 8 are then filled by depositing a metal and etching back to form metal contacts 66. The metal contacts 66 can be formed from tungsten, aluminum/copper, or copper.

Continuing with FIG. 9, a low-resistivity metal layer 68, such as Al/Cu, is deposited to a thickness of between about 4000 and 6000 Angstroms, and is patterned to form first metal interconnections. An interlevel dielectric (ILD) layer 70, such as SiO$_2$, is deposited by high-density plasma CVD using TEOS as the reactant gas. Next, fifth contact openings are etched and filled with metal to form the next level of metal plugs 72 for the next level of metal interconnections (not shown).

The process for forming the first level of interconnections is then repeated to complete the wiring of the merged integrated circuit.

While the invention has been particularly shown and described with reference to the preferred embodiment thereof, it will be understood by those skilled in the art that various changes in form and details may be made without departing from the spirit and scope of the invention.

What is claimed is:

1. A method for fabricating a merged integrated circuit having salicide field effect transistors (FETs) integrated with dynamic random access memory (DRAM) comprising the steps of:

providing a semiconductor substrate having a logic region and a memory region having device areas, said device areas surrounded and electrically isolated from each other by field oxide areas;

forming a first gate oxide on said device areas;

depositing an undoped first polysilicon layer;

depositing a first insulating layer on said first polysilicon layer;

removing said first insulating layer and said first polysilicon layer over said memory region;

forming a second gate oxide on said device areas in said memory region;

depositing a doped second polysilicon layer and a refractory metal silicide layer to form a first polycide layer;

depositing a hard-mask layer;

patterning by masking and etching said hard-mask layer and first polycide layer to form gate electrodes in said device areas of said memory region, while protecting said logic region from etching;

forming first source/drain areas adjacent to said gate electrodes in said memory region;

forming insulating sidewall spacers on said gate electrodes in said memory region;

forming a blanket conformal liner layer;

depositing a second insulating layer to form an interpolysilicon oxide-1;

chemically-mechanically polishing back said second insulating layer to said hard-mask layer over said logic region, and forming a planar second insulating layer over said memory region;

removing said hard-mask layer, said first polycide layer, and said first insulating layer over said logic region, while said second insulating layer protects said memory region;

patterning said undoped first polysilicon layer to form gate electrodes in said device areas of said logic region;

forming lightly doped source/drain areas adjacent to said gate electrodes in said logic region;

forming insulating sidewall spacers on said gate electrodes in said logic region;

forming second source/drain areas by ion implantation adjacent to said sidewall spacers on said gate electrodes in said logic region, and concurrently doping said undoped polysilicon gate electrodes;

forming a conformal metal layer and annealing to selectively form a metal silicide on said second source/drain areas and said polysilicon gate electrodes, and etching to remove said metal that is unreacted on said sidewall spacers and elsewhere on said substrate, thereby forming said salicide FETs;

depositing a blanket etch-stop layer;

depositing a third insulating layer and polishing back to said second insulating layer over said memory region;

etching first contact openings in said second insulating layer and filling with a doped third polysilicon layer to form bit-line polysilicon plugs and capacitor node polysilicon plugs self-aligned to said gate electrodes in said memory region;

depositing a fourth insulating layer and etching second contact openings to said bit-line polysilicon plugs;

depositing a second polycide layer and patterning to form bit lines;

depositing a fifth insulating layer to form an interpolysilicon oxide-2 layer, and etching third contact openings and filling with a doped polysilicon to form electrical contacts to said capacitor node polysilicon plugs;

forming stacked capacitors over said electrical contacts, and depositing and planarizing a sixth insulating layer on said stacked capacitors;

etching fourth contact openings to said first polycide layer in said memory region and to said metal silicide on said second source/drain areas in said logic region and filling with an electrically conducting material to form electrical contacts;

depositing and patterning a low-resistivity metal layer to form first metal interconnections, and depositing an interlevel dielectric layer and etching fifth contact openings for the next level of metal interconnections, and repeating said metal deposition and patterning, and said interlevel dielectric layer deposition for each level necessary to complete said merged integrated circuit.

2. The method of claim 1, wherein said first gate oxide is grown to a thickness of between about 20 and 100 Angstroms.

3. The method of claim 1, wherein said first polysilicon layer is deposited by low-pressure chemical vapor deposition to a thickness of between about 1000 and 1500 Angstroms.

4. The method of claim 1, wherein said second gate oxide is grown to a thickness of between about 80 and 100 Angstroms.

5. The method of claim 1, wherein said second polysilicon layer is doped with phosphorus and is deposited to a thickness of between about 1000 and 1500 Angstroms, and said refractory metal silicide is tungsten silicide deposited to a thickness of between about 1000 and 1500 Angstroms.

6. The method of claim 1, wherein said hard-mask layer consists of a silicon oxide layer deposited to a thickness of between about 200 and 400 Angstroms and an upper silicon nitride layer deposited to a thickness of between about 1500 and 2000 Angstroms.

7. The method of claim 1, wherein said first source/drain areas are implanted with phosphorus ions ($p^{31}$) at a dose of between about 1.0 E 13 and 1.0 E 14 atoms/cm$^2$ and at an implant energy of between about 20 and 50 KeV.

8. The method of claim 1, wherein said lightly doped source/drain areas are implanted with arsenic ions ($As^{75}$) at a dose of between about 1.0 E 13 and 1.0 E 14 atoms/cm$^2$ and at an implant energy of between about 20 and 40 KeV.

9. The method of claim 1, wherein said metal silicide is formed by:

depositing a titanium layer to a thickness of between about 200 and 400 Angstroms;

rapid thermal annealing at a temperature of about 500 to 700° C. for about 30 seconds to form titanium silicide;

removing said unreacted titanium metal by a wet etching in a solution of $NH_4OH$ and $H_2O_2$;

carrying out a second rapid thermal annealing at a temperature of about 700 to 900° C. for about 30 seconds to complete the phase formation of said titanium silicide.

10. The method of claim 1, wherein said blanket etch-stop layer is silicon oxynitride deposited to a thickness of between about 200 and 500 Angstroms, and is used as an etch-stop layer for etching said fourth contact openings to said second source/drain areas for said metal contacts.

11. A method for fabricating a merged integrated circuit having salicide field effect transistors (FETs) integrated with dynamic random access memory (DRAM) comprising the steps of:

providing a semiconductor substrate having a logic region and a memory region having device areas, said device areas surrounded and electrically isolated from each other by field oxide areas;

forming a first gate oxide on said device areas;

depositing an undoped first polysilicon layer;

depositing a first insulating layer on said first polysilicon layer;

removing said first insulating layer and said first polysilicon layer over said memory region;

forming a second gate oxide on said device areas in said memory region;

depositing a doped second polysilicon layer and a tungsten metal silicide layer to form a first polycide layer;

depositing a silicon nitride hard-mask layer;

patterning by masking and etching said hard-mask layer and said first polycide layer to form gate electrodes in said device areas of said memory region, while protecting said logic region from etching;

forming first source/drain areas adjacent to said gate electrodes in said memory region;

forming insulating sidewall spacers on said gate electrodes in said memory region;

forming a blanket conformal liner layer;

depositing a second insulating layer to form an interpolysilicon oxide-1;

chemically-mechanically polishing back said second insulating layer to said hard-mask layer over said logic region, and forming a planar second insulating layer over said memory region;

removing said hard-mask layer, said first polycide layer, and said first insulating layer over said logic region, while said second insulating layer protects said memory region;

patterning said undoped first polysilicon layer to form gate electrodes in said device areas of said logic region;

forming lightly doped source/drain areas adjacent to said gate electrodes in said logic region;

forming insulating sidewall spacers on said gate electrodes in said logic region;

forming second source/drain areas by ion implantation adjacent to said sidewall spacers on said gate electrodes in said logic region, and concurrently doping said undoped polysilicon gate electrodes;

depositing a conformal titanium metal layer and annealing to selectively form a titanium silicide on said second source/drain areas and on said polysilicon gate electrodes, and etching to remove said titanium metal that is unreacted on said sidewall spacers and elsewhere on said substrate, thereby forming said salicide FETs;

depositing a blanket etch-stop layer;

depositing a third insulating layer and polishing back to said second insulating layer over said memory region;

etching first contact openings in said second insulating layer and filling with a doped polysilicon layer to form bit-line polysilicon plugs and capacitor node polysilicon plugs self-aligned to said gate electrodes in said memory region;

depositing a fourth insulating layer and etching second contact openings to said bit-line polysilicon plugs;

depositing a second polycide layer and patterning to form bit lines;

depositing a fifth insulating layer to form an interpolysilicon oxide-2 layer, and etching third contact openings and filling with a doped polysilicon to form electrical contacts to said capacitor node polysilicon plugs;

forming stacked capacitors over said electrical contacts, and depositing and planarizing a sixth insulating layer on said stacked capacitors;

etching fourth contact openings to said first polycide layer in said memory region and to said metal silicide on said second source/drain areas in said logic region and filling with metal to form metal contacts;

depositing and patterning a metal layer to form first metal interconnections, and depositing an interlevel dielectric layer and etching fifth contact openings for the next level of metal interconnections, and repeating said metal deposition and said interlevel dielectric layer deposition for each level necessary to complete said merged integrated circuit.

12. The method of claim 11, wherein said first gate oxide is grown to a thickness of between about 20 and 100 Angstroms.

13. The method of claim 11, wherein said first polysilicon layer is deposited by low-pressure chemical vapor deposition to a thickness of between about 1000 and 1500 Angstroms.

14. The method of claim 11, wherein said second gate oxide is grown to a thickness of between about 80 and 100 Angstroms.

15. The method of claim 11, wherein said second polysilicon layer is doped with phosphorus and is deposited to a thickness of between about 1000 and 1500 Angstroms, and said tungsten silicide is deposited to a thickness of between about 1000 and 1500 Angstroms.

16. The method of claim 11, wherein said hard-mask layer consists of a silicon oxide layer deposited to a thickness of between about 200 and 400 Angstroms and an upper silicon nitride layer deposited to a thickness of between about 1500 and 2000 Angstroms.

17. The method of claim 11, wherein said first source/drain areas are implanted with phosphorus ions ($p^{31}$) at a dose of between about 1.0 E 13 and 1.0 E 14 atoms/cm$^2$ and at an implant energy of between about 20 and 50 KeV.

18. The method of claim 11, wherein said lightly doped source/drain areas are implanted with arsenic ions ($As^{75}$) at a dose of between about 1.0 E 13 and 1.0 E 14 atoms/cm$^2$ and at an implant energy of between about 20 and 40 KeV.

19. The method of claim 11, wherein said titanium metal silicide is formed by:

depositing a titanium layer to a thickness of between about 200 and 400 Angstroms;

rapid thermal annealing at a temperature of about 500 to 700° C. for about 30 seconds to form titanium silicide;

removing said unreacted titanium metal by a wet etching in a solution of $NH_4OH$ and $H_2O_2$;

carrying out a second rapid thermal annealing at a temperature of about 700 to 900° C. for about 30 seconds to complete the phase formation of said titanium silicide.

20. The method of claim 11, wherein said blanket etch stop layer is silicon oxynitride deposited to a thickness of between about 200 and 500 Angstroms, and is used as an etch-stop layer for etching said fourth contact openings to said second source/drain areas for said metal contacts.

* * * * *